United States Patent
Chen et al.

(10) Patent No.: US 9,712,181 B1
(45) Date of Patent: Jul. 18, 2017

(54) INCREMENTAL PRELOADING IN AN ANALOG-TO-DIGITAL CONVERTER

(71) Applicant: Analog Devices, Inc., Norwood, MA (US)

(72) Inventors: Baozhen Chen, Woburn, MA (US); Edward C. Guthrie, Charlestown, MA (US); Michael C. W. Coln, Lexington, MA (US); Mark D. Maddox, Derry, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/273,967

(22) Filed: Sep. 23, 2016

(51) Int. Cl.
| H03M 1/46 | (2006.01) |
| H03M 1/80 | (2006.01) |
| H03M 1/68 | (2006.01) |
| H03M 1/12 | (2006.01) |

(52) U.S. Cl.
CPC ......... *H03M 1/466* (2013.01); *H03M 1/1245* (2013.01); *H03M 1/68* (2013.01); *H03M 1/806* (2013.01)

(58) Field of Classification Search
None
See application file for complete search history.

(56) References Cited

U.S. PATENT DOCUMENTS

| 6,046,719 | A  | * | 4/2000 | Dingwall | G09G 3/2011 341/150 |
| 6,154,162 | A  | * | 11/2000 | Watson | H03M 1/0673 341/144 |
| 6,452,527 | B2 | * | 9/2002 | Takeya | H03M 1/066 341/144 |
| 7,961,131 | B2 | * | 6/2011 | Craninckx | H03M 1/0682 341/155 |
| 8,004,448 | B2 |   | 8/2011 | Carreau | |
| 8,537,045 | B2 | * | 9/2013 | Kapusta | H03M 1/0845 341/144 |

OTHER PUBLICATIONS

Haenzsche et al., Analysis of a Charge Redistribution SAR ADC with Partially Thermometer Coded DAC, Sep. 2013, IEEE, 2013 European Conference on Circuit Theory and Design (ECCTD), IEEE Xplore Nov. 2013.*

Hyun-Wook Kang et al., Ternary-level Thermometer C-DAC Switching Scheme for Flash-Assisted SAR ADCs, IEICE Electronics Express, Apr. 2015, IEICE.*

* cited by examiner

*Primary Examiner* — Howard Williams
(74) *Attorney, Agent, or Firm* — Schwegman Lundberg & Woessner, P.A.

(57) ABSTRACT

During operation of a SAR ADC, several of the MSBs can be preloaded with predetermined bit decisions prior to carrying out bit trials. A system and method can be provided for incrementally preloading the predetermined bit decisions such as to maintain voltages present at comparator inputs within a limited range of acceptable input voltages.

20 Claims, 8 Drawing Sheets

|   | 250 | 251 | 252 |
|---|---|---|---|
|   | GROUP 1 | GROUP 1 | GROUP 1 |
|   | GROUP 2 | GROUP 2 | GROUP 2 |
|   | GROUP 3 | GROUP 3 | GROUP 3 |
|   | GROUP 4 | GROUP 4 | GROUP 4 |

FIG. 2A

|   | 250 | 251 | 252 |
|---|---|---|---|
|   | GROUP 1 | GROUP 1 | GROUP 1 |
|   | GROUP 2 | GROUP 2 | GROUP 2 |
|   | GROUP 3 | GROUP 3 | GROUP 3 |
|   | GROUP 4 | GROUP 4 | GROUP 4 |

FIG. 2B

|   | 250 | 251 | 252 |
|---|---|---|---|
|   | GROUP 1 | GROUP 1 | GROUP 1 |
|   | GROUP 2 | GROUP 2 | GROUP 2 |
|   | GROUP 3 | GROUP 3 | GROUP 3 |
|   | GROUP 4 | GROUP 4 | GROUP 4 |

FIG. 2C

|   | 250 | 251 | 252 |
|---|---|---|---|
|   | GROUP 1 | GROUP 1 | GROUP 1 |
|   | GROUP 2 | GROUP 2 | GROUP 2 |
|   | GROUP 3 | GROUP 3 | GROUP 3 |
|   | GROUP 4 | GROUP 4 | GROUP 4 |

FIG. 2D

|   | 250 | 251 | 252 |
|---|---|---|---|
|   | GROUP 1 | GROUP 1 | GROUP 1 |
|   | GROUP 2 | GROUP 2 | GROUP 2 |
|   | GROUP 3 | GROUP 3 | GROUP 3 |
|   | GROUP 4 | GROUP 4 | GROUP 4 |

FIG. 2E

INCREMENTAL PRELOADING IN AN ANALOG-TO-DIGITAL CONVERTER

FIELD OF THE DISCLOSURE

The present disclosure relates to systems and methods for operating a successive approximation register (SAR) SAR analog-to-digital converter (ADC).

BACKGROUND

Certain successive approximation register (SAR) analog-to-digital converters (ADCs) include a digital-to-analog converter (DAC) that can sample an input voltage and a comparator that compares the sampled input voltage to a reference voltage and outputs a digital result during bit trials.

SUMMARY OF THE DISCLOSURE

In a SAR ADC having a comparator, the voltage at the input of the comparator, such as that provided by the top plates of the DAC, can exceed allowable levels during bit trials of the ADC. The inventors have recognized, among other things, a need for a SAR ADC that may perform bit trials without exceeding a voltage limit of a comparator included in a SAR ADC.

In certain systems, the first few most significant bits (MSBs) can be predetermined, such as by using an auxiliary ADC. The predetermined MSBs can be loaded onto the DAC prior to carrying out bit trials. In such a system where the MSBs can be loaded prior to carrying out bit trials, out of rail voltages at the comparator inputs can be reduced. However, in certain systems where MSBs can be loaded before carrying out bit trials, a transient out of rail voltage may be present at the inputs of the comparator, such as during the preloading of the MSBs, such as due to timing jitter or variations in RC delays, such as which can lead to a loss of signal charge and a degradation of the analog-to-digital conversion process. The inventors have recognized, among other things, that it is possible to incrementally load each of the first few MSBs to avoid exceeding the voltage limits at the input of the comparator.

In an aspect, the disclosure can feature a method of loading at least one bit decision onto a charge redistribution digital-to-analog converter (DAC) including an array of capacitive elements corresponding to different bit positions. The method can include partially loading onto a first element having a first bit position, a charge associated with a first bit decision of the first element having the first bit position. The method can also include at least partially loading onto a second element having a second bit position that can be different from the first bit position, a charge associated with a second bit decision of the second element having the second bit position. The method can also include then further loading onto the first element having the first bit position, further charge associated with the first bit decision of the first element. The partially loading onto the first element having the first bit position can include applying a voltage associated with the first bit decision of the first element having the first bit position onto a capacitor segment that can be less than an entire aggregate capacitor associated with the first element having the first bit position. The method can also include determining a relationship between charge associated with the first bit decision and charge associated with the second bit decision and based on the determined relationship, incrementally performing the loading of charge onto the first element and the second element.

The method can also include predetermining the first bit decision and the second bit decision using a separate auxiliary ADC. The first element and the second element can respectively correspond to the most significant bit and the next most significant bit of the DAC. The partially loading onto the first element having a first bit position and the at least partially loading onto the second element having a second bit position can be performed concurrently. The method can also include then further loading onto the first element having the first bit position, further charge associated with the first bit decision of the first element and further loading onto the second element having the second bit position, further charge associated with the second bit decision of the second element, wherein the further loading onto the first element and the further loading onto the second element can be performed concurrently. The partially loading onto the first element having a first bit position and the at least partially loading onto the second element having a second bit position can be performed sequentially.

In an aspect, the disclosure can feature a system for loading at least one bit decision onto a charge redistribution digital-to-analog (DAC) converter having an array of capacitive elements. The system can include a first element having a first bit position. The system can also include a second element having a second bit position that can be different from the first bit position. The system can also include control circuitry configured to (i) partially load onto the first element having a first bit position, a charge associated with a first bit decision of the first element having the first bit position (ii) at least partially loading onto the second element having a second bit position, a charge associated with a second bit decision of the second element having the second bit position, and (iii) then further load onto the first element having the first bit position, further charge associated with the first bit decision of the first element. The first element having the first bit decision can include multiple capacitor segments and the control circuitry can be further configured to apply a voltage associated with the first bit decision of the first element having the first bit position onto at least one capacitor segment, but not all of the multiple capacitor segments of the first element. The control circuitry can be further configured to determine a relationship between charge associated with the first bit decision and charge associated with the second bit decision, and based on the determined relationship, can incrementally perform the loading of charge onto the first element and the second element. The system can also include a separate auxiliary ADC configured to predetermine the first bit decision and the second bit decision. The first element and the second element can respectively correspond to the most significant bit and the next most significant bit of the DAC. The controller can be further configured to load charge onto the first element and the second element concurrently. The controller can be further configured to then further load onto the first element having the first bit position, further charge associated with the first bit decision of the first element and simultaneously further load onto the second element having the second bit position, further charge associated with the second bit decision of the second element. The controller can be further configured to load charge onto the first element and the second element sequentially.

In an aspect, the disclosure can feature a method of loading at least one bit decision onto a charge redistribution digital-to-analog converter (DAC) including a thermometer encoded array including a sequence of logically adjacent capacitive cells corresponding to different bit positions. The method can include loading onto a first cell having a position in the array of capacitive cells determined by a logical midpoint of the thermometer encoded array, a charge associated with a decoded most significant bit (MSB) decision. The method can also include then loading onto a second cell logically adjacent to the first cell, a charge associated with a decoded second bit decision, and loading onto a third element logically adjacent to the first cell, a charge associated with a decoded third bit decision. The decoded MSB decision can be a majority bit decision included with a majority of the capacitive cells sharing a like charge in the sequence of logically adjacent capacitive cells. The second bit decision can be a majority bit decision included with a majority of the capacitive cells sharing a like charge in the sequence of logically adjacent capacitive cells, and the third bit decision can be a minority bit decision included with a minority of the capacitive cells sharing a like charge in the sequence of adjacent capacitive cells. The second bit decision can be a majority bit decision included with a majority of the capacitive cells sharing a like charge in the sequence of logically adjacent capacitive cells, and the third bit decision can be a majority bit decision included with a majority of the capacitive cells sharing a like charge in the sequence of adjacent capacitive cells.

BRIEF DESCRIPTION OF THE DRAWINGS

The present disclosure will now be described, by way of example, with reference to the accompanying drawings, in which:

FIGS. 2A-2E illustrate a method for incrementally loading the first few MSBs in a SAR ADC.

DETAILED DESCRIPTION OF EMBODIMENTS OF THE DISCLOSURE

In a SAR ADC having a DAC, the first few MSBs can be predetermined, such as by an auxiliary ADC and preloaded onto the DAC prior to carrying out bit trials. Preloading the first few MSBs can provide for voltages at the top plates of the DAC that can be within the voltage limits of a comparator connected to the DAC. In some situations, preloading of the first few MSBs may cause a voltage at the top plates of the DAC to exceed or further exceed the voltage limits of the comparator, such as due to timing jitter or variations in RC delays, leading to a loss of signal charge. The inventors have recognized, among other things, that it is possible to incrementally load each of the first few MSBs, such as to avoid exceeding the voltage limits at the input of the comparator, such as even in the presence of timing jitter or variations in RC delays.

Figure 1A:
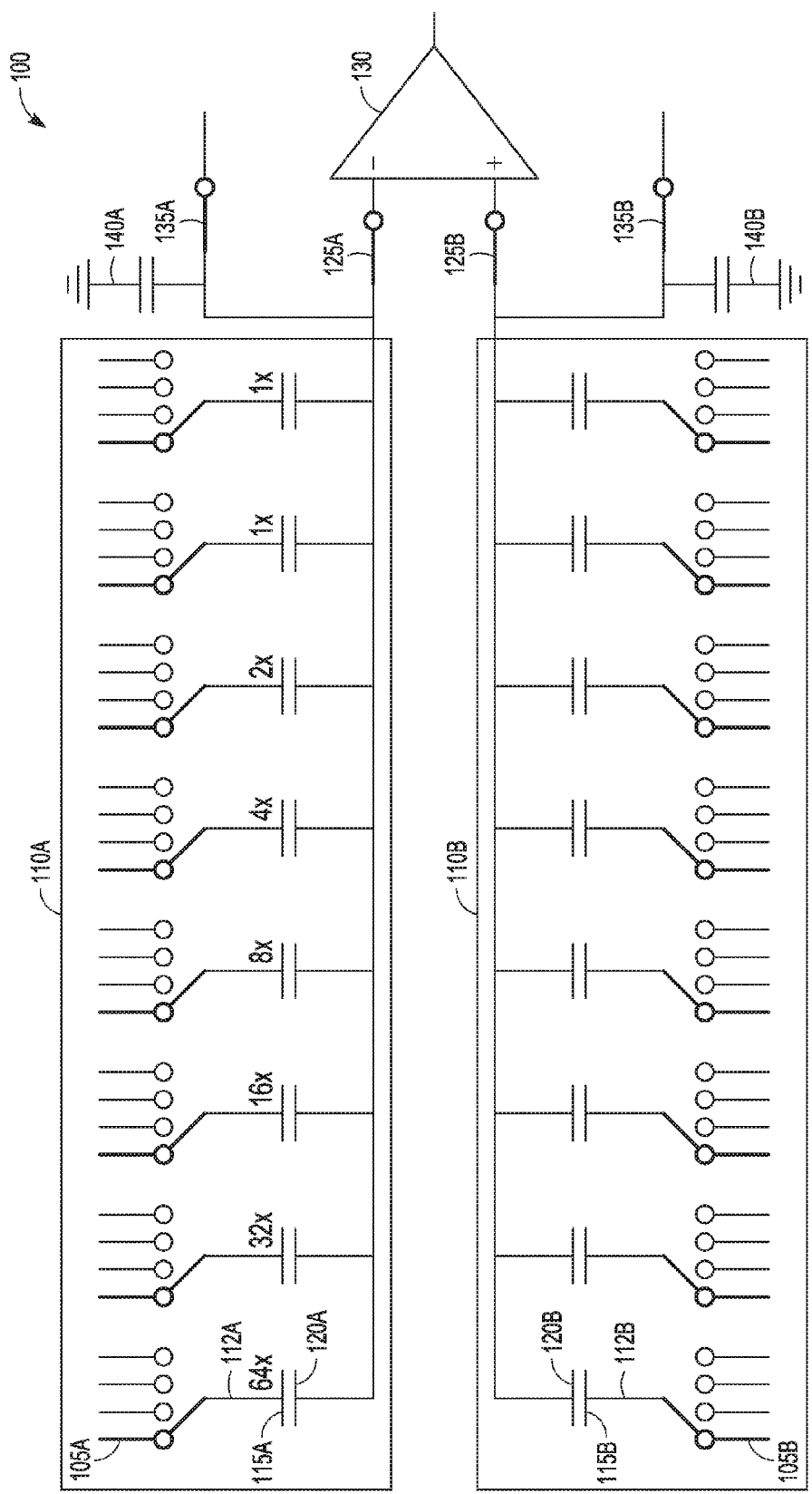
FIGS. 1A-1C illustrate diagrams of a SAR ADC.

FIG. 1A shows an example of a SAR ADC 100. The SAR ADC 100 can include a first DAC 110a, a second DAC 110b, input sampling switches 105a and 105b, comparator input switches 125a, and 125b, comparator 130, and top plate sampling switches 135a and 135b. The first DAC 110a can include an array of capacitors 112a corresponding to different bit positions, and each capacitor 112a can include a top plate 120a and a bottom plate 115a. The array of capacitors 112a can include one or more parasitic capacitances 140a.

The second DAC 110b can include an array of capacitors 112b corresponding to different bit positions, and each capacitor 112b can include a top plate 120b and a bottom plate 115b. The array of capacitors 112b can include one or more parasitic capacitances 140b. In an example, the array of capacitors 112a and 112b can be binary weighted capacitors. The bottom plates 115a and 115b can be connected to the input sampling switches 105a and 105b, respectively. The top plates 120a and 120b can be connected to the top plate sampling switches 135a and 135b, respectively. The top plates 120a and 120b can also be connected to the comparator input switches 125a and 125b, respectively. The inputs of the comparator 130 can generally accept voltages in a range between zero volts and $V_{dd}$, a positive supply voltage.

During a sampling phase of the SAR ADC 100, the input sampling switches 105a and 105b can connect a first input voltage and a second input voltage to the bottom plates 115a and the bottom plates 115b, respectively. The first input voltage and the second voltage can be in a range between a first reference voltage and a second reference voltage, respectively. The top plate sampling switches 135a and 135b can connect a top plate common mode voltage to the top plates 120a and top plates 120b, respectively.

Figure 1B:
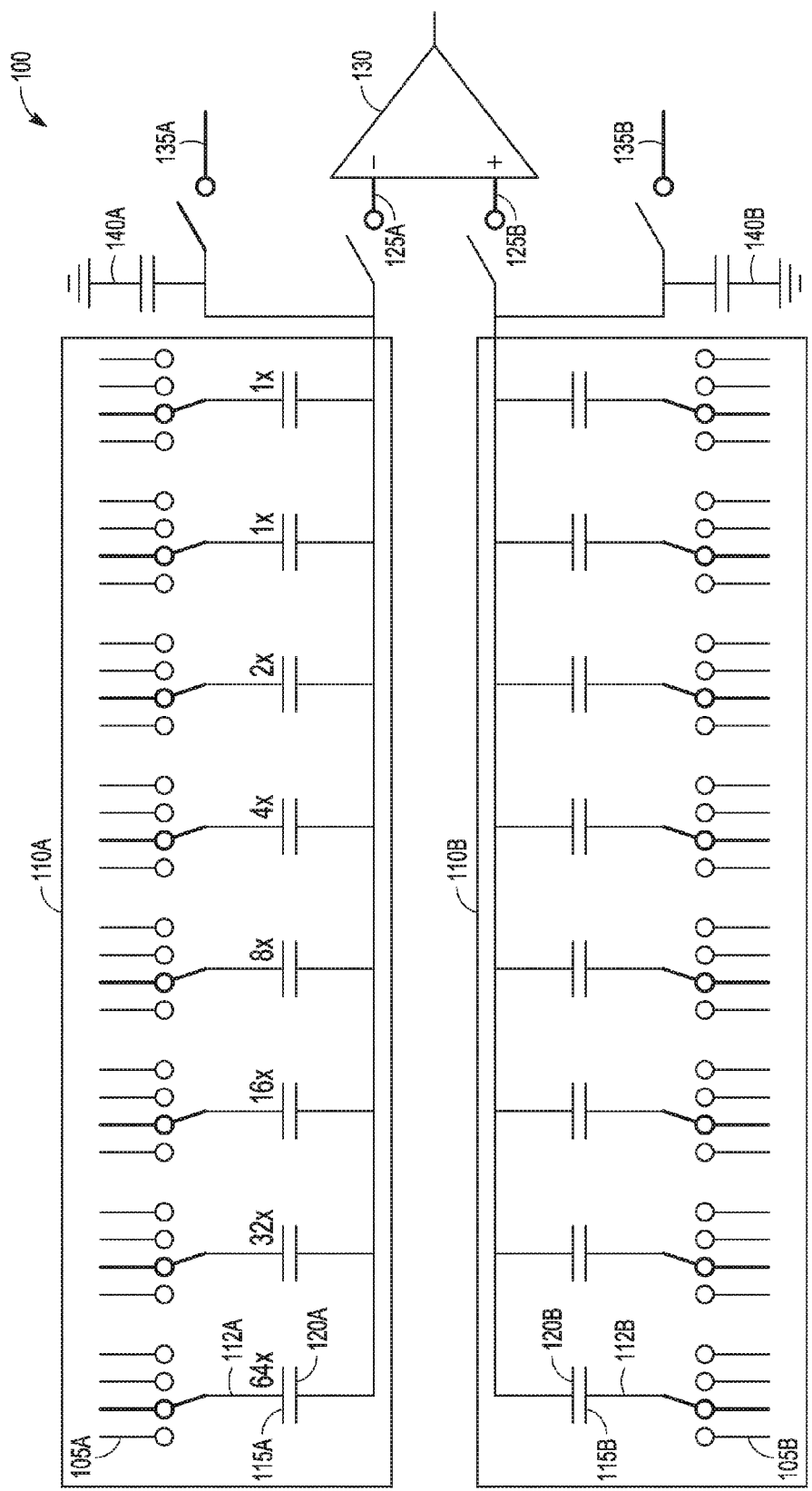

During a hold phase of the SAR ADC 100 as shown in FIG. 1B, the input sampling switches 105a and 105b can disconnect the first input voltage and the second input voltage from the bottom plates 115a and 115b, respectively. The top plate sampling switches 135a and 135b can disconnect the top plate common mode voltage from the top plates 120a and 120b, respectively. The comparator input switches 125a and 125b can be opened, such as to disconnect the comparator inputs from the top plates 120a and 120b, respectively. The input sampling switches 105a and 105b can then connect the bottom plates 115a and 115b to a common mode voltage, respectively. In an example, the common mode voltage can be an average of a positive reference voltage and a negative reference voltage (e.g., for a positive reference voltage of 5V and a negative reference voltage of 0V, the common mode voltage can be 2.5V). During a conversion phase, the comparator input switches 125a and 125b can then be closed, and bit trials can be carried out by the SAR ADC 100.

Bit trials can be carried out after the sampling phase and the hold phase. After the sampling phase and the hold phase, the comparator input switches 125a and 125b can be closed, such as to connect the comparator inputs to the top plates 120a and 120b, respectively. The comparator 130 can then make a comparison, such as between a voltage at the top plates 120a of the first DAC 110a and a voltage at the top plates 120b of the second DAC 110b, and based on the comparison, a charge corresponding to a bit decision can be loaded onto the bottom plates 115a and 115b of the capacitors 112a and 112b corresponding to a digital bit. A charge corresponding to the bit decision can be loaded by closing switches 105a and 105b, such as to connect to a voltage that can correspond to a digital high or a digital low (e.g., a digital high can correspond to 5 volts and a digital low can correspond to 0 volts), such as which can cause a charge to be transferred to the capacitors 112a and 112b corresponding to the digital bit being loaded. Bit trials can be carried out until bit decisions have been loaded onto each pair of bottom plates 115a and 115b corresponding to a digital bit position. As the bit decisions are loaded, the common mode voltage can be gradually disconnected from the bottom plates 115a and 115b, bit by bit, and the common mode voltage at comparator inputs can gradually approach the sampled top plate common mode voltage.

In an example, during a sampling phase such as shown in FIG. 1A, a 4V signal can be applied to the bottom plates 115a of the first DAC 110a, a 1V signal can be applied to the bottom plates 115b of the second DAC 110b, and a top plate common mode voltage of 0.9V can be applied to the top plates 120a of the first DAC 110a and the top plates 120b of the second DAC 110b. In such an example, during the hold phase as shown in FIG. 1B, the top plates 120a of the first DAC 110a and the top plates 120b of the second DAC 110b can be disconnected from the top plate common mode voltage of 0.9V. The input sampling switches 105a can be opened to disconnect the 4V signal and the 1V signal from the bottom plates 115a and 115b of the first and second DACs 110a and 110b, respectively. After applying the common mode voltage, the voltage at the top plates 120a of the first DAC 110a can be −0.6V and the voltage at the top plates 120b of the second DAC 110b can be 2.4V, where the voltage of −0.6V can be outside the limits of the comparator inputs, such as when the comparator inputs are limited to voltages in a range from 0V to 5V. This can lead to a loss of charge representing the analog signal being converted and, therefore, degradation of the analog-to-digital conversion process.

Figure 1C:
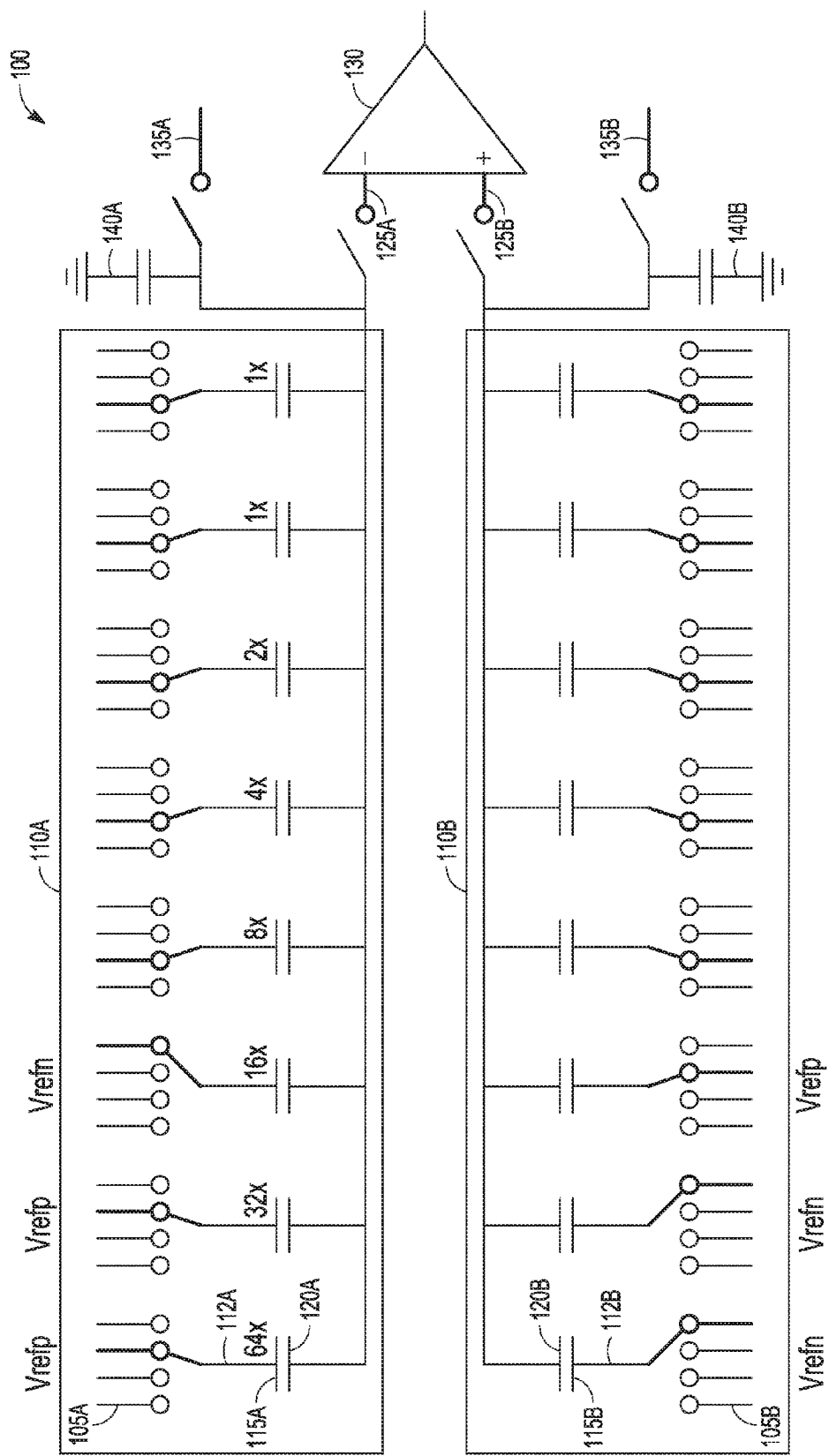

In certain systems, such as shown in FIG. 1C, prior to carrying out bit trials, at least one of the most significant bit decisions can be loaded onto the bottom plates 115a and 115b of the capacitors 112a and 112b corresponding to the at least one most significant bit, such as to prevent the voltage at the top plates 120a and 120b from exceeding the limits of the comparator inputs. Then at least one most significant bit decision can be determined by an auxiliary ADC. A charge corresponding to a digital high can be loaded such as by connecting switch 105a to a positive reference voltage and connecting switch 105b to a negative reference voltage. A charge corresponding to a digital low can be loaded such as by connecting switch 105a to a negative reference voltage and connecting switch 105b to a positive reference voltage. After loading a charge corresponding to a digital high, the voltage at the top plates 120a can increase, and the voltage at the top plates 120b can decrease by the following amount:

$$\Delta = \frac{C_x}{C_{total}} * (V_{refp} - V_{cm})$$

Where $\Delta$ can represent the amount of increase or decrease in voltage at the top plates 120, $C_x$ can represent the capacitance that has been loaded with the charge corresponding to a digital high, $C_{total}$ can represent the total effective capacitance seen by the DAC top plate nodes, such as those connected to the DAC top plates 120a and 120b, $V_{refp}$ can represent a positive reference voltage, and $V_{cm}$ can represent the common mode voltage. $C_{total}$ can change throughout the preloading process. Similarly, after loading a charge corresponding to a digital low, the voltage at the top plates 120a can decrease by $\Delta$ and the voltage at the top plates 120b can increase by $\Delta$. Continuing with the example above, a charge corresponding to a digital high can be loaded onto the most significant bit, a charge corresponding to a digital high can be loaded onto the second most significant bit, and a charge corresponding to a digital low can be loaded on the third most significant bit, prior to carrying out bit trials. After loading bit decisions into the three most significant bits, the voltage at the top plates 120a can settle to 0.8375 V and the voltage at the top plates 120b can settle to 0.9625 V both of which are within the voltage limits of the comparator. In the example, by preloading at least one most significant bit decision prior to carrying out bit trials, the voltages of −0.6V and 2.4V at the top plates of the DAC can be avoided, which can reduce charge loss.

However, during the loading of charge corresponding to bit decisions into the capacitors that correspond to the three most significant bits as described in the example, the voltage at the top plates may temporarily further exceed the voltage limits of the comparator inputs. In an example, imperfections in timing circuitry such as jitter and variations in RC delays can cause the bit decisions to be loaded in an uncontrolled sequence. In an example where the capacitors 112 corresponding to the three most significant bits are not connected to the common mode voltage and the capacitor corresponding to the third most significant bit decision can be loaded with a charge corresponding to a digital low before the capacitors corresponding to the first and second most significant bits are loaded with a charge corresponding to a digital high, the voltage at the top plates 120a can decrease from 0.9V to −3.1V and the voltage at the top plates 120b can increase from 0.9V to 4.9V. To avoid situations where the preloading of bit decisions can cause the voltage at the top plates 120a or 120b to exceed or further exceed the voltage limits of the comparator inputs, a gentle jamming technique can be employed where the preloading of bit decisions can be done incrementally. In an example of incrementally preloading bit decisions, a portion of the charge corresponding to a first predetermined bit decision can be loaded onto a first capacitive element corresponding to a first bit position such as to cause the voltage at the top plates to change by an amount proportional to the portion of loaded charge. In an example, the charge corresponding to a bit decision can be 1 C, the voltage corresponding to a bit decision can be 1.25V, and the portion of charge loaded can be 0.25 C, such as to cause a change in the voltage at the top plates 120a and 120b of 0.3125V. In an example, capacitive elements corresponding to the three most significant bits of the DAC can be sequentially loaded with portions of charge corresponding to predetermined bit decisions until bit decisions have been loaded on the capacitive elements. The sequence can be selected, such as to minimize voltages at the top plates that can be outside the range of allowed voltages of the comparator. FIGS. 2A-2E, show a method of incrementally preloading predetermined bit decisions into a DAC. In the example shown in FIGS. 2A-2E, charge corresponding to predetermined bit decisions, such as those determined by an auxiliary ADC can be incrementally loaded, such as onto the three most significant bits of the DAC prior to carrying out bit trials. FIGS. 2A-2E show a capacitive element 250 corresponding to a most significant bit, a capacitive element 251 corresponding to a second most significant bit, and a capacitive element 252 corresponding to a third most significant bit. In an example, the first capacitive element 250 can include 16 segments, the second capacitive element 251 can include 8 segments, and the third capacitive element 252 can include 4 segments. Each segment can represent a portion of an aggregate capacitive element. The segments can be grouped into a first, second, third, and fourth group, with each group including 4 segments from the first capacitive element 250, 2 segments from the second capacitive element 251, and 1 segment from the third capacitive element 252. During a first step as shown in FIG. 2B, charge corresponding to the predetermined bit decisions can be loaded onto segments corresponding to the first group, such as can correspond to concurrently partially loading the capacitive elements 250, 251, and 252. In a second step as shown in FIG. 2C, charge corresponding to the predetermined bit decisions can be loaded onto segments corresponding to the second group, such as can correspond to concurrently further partially loading the capacitive elements 250, 251, and 252. In a third step as shown in FIG. 2D, charge corresponding to the predetermined bit decisions can be loaded onto segments corresponding to the third group such as can correspond to concurrently further partially loading the capacitive elements 250, 251, and 252. In a fourth step as shown in FIG. 2E, charge corresponding to the predetermined bit decisions can be loaded onto segments corresponding to the fourth group such as can correspond to concurrently further partially loading the capacitive elements 250, 251, and 252. After the first, second, third, and fourth steps, the capacitive elements 250, 251, and 252 can be loaded with a charge corresponding to the predetermined bit decisions, such as those determined by the auxiliary ADC. In accordance with the example described in FIG. 1C, a bit decision corresponding to a digital high can be incrementally loaded onto the capacitive elements 250 and 251, and a bit decision corresponding to a digital low can be incrementally loaded onto the capacitive element 252. During a preloading process, such as that shown in FIGS. 2B-2E, the voltages on the top plates can be determined according to the expression $$\Delta = \frac{C_x}{C_{total}} * (V_{refp} - V_{cm})$$

as discussed above in regard to FIG. 1C. As discussed above, $C_{total}$ can represent the effective capacitance seen at the top plate nodes, such as the nodes connected to top plates 120a and 120b, and the effective capacitance can change during the loading process. In an example, the parasitic capacitance associated with the bottom plate nodes, such as those attached to bottom plates 115a and 115b can be ⅑ of the capacitance values associated with capacitors 112a and 112b. A capacitance of the top plate nodes, such as those connected to the top plates 120a and 120b can be represented by $C_{p1}$ and can have a value of 8 C, where C can represent a unit capacitance. The capacitive element 250 corresponding to the MSB can have a capacitance of 64 C, the capacitive element 251 corresponding to the second MSB can have a capacitance of 32 C, and the capacitive element 252 corresponding to the third MSB can have a capacitance of 16 C. The capacitive elements corresponding to least significant bits are not shown in FIG. 2. After sampling, the bottom plates 115a and 115b can be floating and $C_{total}$ can be provided by the following expression:

$$C_{total} = 128C * \left(\frac{1}{1 + \frac{1}{\frac{1}{9}}}\right) + C_{p1} = 20.8C$$

Prior to loading a charge onto the first group as shown in FIG. 2A, the voltage at the top plates 120a can be 0.9V and the voltage at the top plates 120b can be 0.9 V. After loading charge onto the capacitive elements 252 in the first group corresponding to a digital low as shown in FIG. 2B, the voltage at the top plates 120a can change from 0.9V to 1.55V and the voltage at the top plates 120b can change from 0.9V to 0.25V, where the change in the top plate voltage 120a can be calculated as $$(5-1)V \times \frac{4C}{4C + 12.4C + 8C} = 0.65 \ V$$

and the change in the top plate voltage 120b can be calculated as $$(0-4)V \times \frac{4C}{4C + 12.4C + 8C} = -0.65 \ V.$$

Next, after loading charge onto the capacitive elements 251 in the first group corresponding to a digital high, the voltage at the top plates 120a can change from 1.55V to 1.2V and the voltage at the top plates 120b can change from 0.25V to 0.5V. In an example where all capacitive elements in group one are loaded with charge corresponding to bit decisions, the voltage at the top plates 120a and 120b can be 0.73V and 1.07V, respectively, where the voltage at the top plates 120a can be described by the following expression $$0.9 \ V + (5-1)V \times \frac{4C}{28C + 10C + 8C} + (0-1)V \times \frac{24C}{28C + 10C + 8C}$$

and the voltage at the top plates 120b can be describe by the following expression $$0.9 \ V + (0-4)V \times \frac{4C}{28C + 10C + 8C} + (5-4)V \times \frac{24C}{28C + 10C + 8C}$$

As can be seen from the above example, although the charge loaded onto the capacitive elements 252 in group one can move the voltage at the top plates 120a and 120b away from 0.9V, because as shown in the example, a smaller part of the signal charge and reference charge can be applied, the voltage at the top plates node 120a and 120b can be kept within a small range. After loading charge onto the second group as shown in FIG. 2C, the voltage at the top plates 120a can decrease from 0.73V to 0.68V and the voltage at the top plates 120b can increase from 1.07V to 1.12V. The voltage at the top plates 120a can be described by the following expression:

$$0.9 \ V + (5-1)V \times \frac{8C}{56C + 7.2C + 8C} + (0-1)V \times \frac{48C}{56C + 7.2C + 8C}$$

and voltage at the top plates 120b can be described by the following expression:

$$0.9 \ V + (0-4)V \times \frac{8C}{56C + 7.2C + 8C} + (5-4)V \times \frac{48C}{56C + 7.2C + 8C}$$

After loading charge onto the third group as shown in FIG. 2D, the voltage at the top plates 120a can decrease from 0.68V to 0.655V and the voltage at the top plates 120b can increase from 1.12V to 1.15V. After loading charge onto the fourth group as shown in FIG. 2E, the voltage at the top plates 120a can decrease from 0.68V to 0.63V and the voltage at the top plates 120b can increase from 1.15V to 1.17V both of which are within the voltage limits of the comparator inputs. After incrementally preloading the predetermined bit decisions as described in FIGS. 2A-2E, the bottom plates 115a and 115b of the capacitive elements not corresponding to the three most significant bits of the DAC can be connected to a common mode voltage of 2.5V. After connecting the bottom plates 115a and 115b to the common mode voltage, the voltage at the top plates 120a and 120b can be 0.841V and 0.959V, respectively. The voltage at the top plates 120a can be described by the following expression:

$$0.9 + (5-1) \times \frac{16C}{128C + 8C} + (0-1) \times \frac{96C}{128C + 8C} + (2.5 - 1) \times \frac{16C}{128C + 8C}$$

and the voltage at the top plates 120b can be described by the following expression:

$$0.9 + (5-4) \times \frac{16C}{128C + 8C} + (0-4) \times \frac{96C}{128C + 8C} + (2.5 - 4) \times \frac{16C}{128C + 8C}$$

In an example where the parasitic capacitances are ignored, the top plate node voltages can settle to 0.8375V and 0.9675V as described above.

In an example, the voltage at the top plates 120a and 120b can increase or decrease in discrete steps as the predetermined bit decisions are incrementally preloaded into the DAC. In an example, such as where each of the capacitive elements can be loaded with charge in four steps, such as to load the predetermined bit decisions, the voltage at the top plates 120a and 120b can increase or decrease in at least four discrete steps. In an example, a current supplied by a reference voltage source can be measured, such as to observe discrete voltage steps, such as those present during an incremental preloading of the DAC.

Figure 3A:
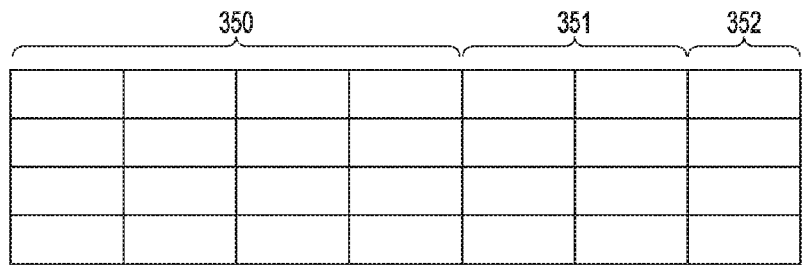
FIGS. 3A-3J illustrate a method for incrementally loading the first few MSBs in a SAR ADC.

FIGS. 3A-3J show a method of preloading predetermined bit decisions into a DAC, such as can be determined by an auxiliary ADC. In the example shown in FIGS. 3A-3J, charge corresponding to the predetermined bit decisions can be incrementally loaded onto the three most significant bits of the DAC prior to carrying out bit trials. FIG. 3A shows a capacitive element 350 that can correspond to a most significant bit, a capacitive element 351 that can correspond to a second most significant bit, and a capacitive element 352 that can correspond to a third most significant bit. In an example, the first capacitive element 350 can include 16 segments, the second capacitive element 351 can include 8 segments, and the third capacitive element 352 can include 4 segments. The capacitive elements corresponding to least significant bits are not shown in FIG. 3. Each segment can represent a portion of an aggregate capacitive element. In an example, the capacitive elements 350, 351, and 352 can include any number of segments. Each segment can represent a portion of a capacitive element. The segments can be grouped into seven groups, with each group containing four segments from one of the capacitive elements. The first group, second group, third group, and fourth group can each include four segments from the first capacitive element 350, the fifth group and sixth group can each include four segments from the second capacitive element 351, and the seventh group can include four segments from the third capacitive element 352. In an example, the charge can be loaded incrementally such that the ratio of charge corresponding to digital high bit decisions to charge corresponding to digital low bit decisions can be held substantially constant during preloading. In some examples, the charge can be loaded incrementally such that the difference between charge corresponding to digital high bit decisions and charge corresponding to digital low bit decisions can be held substantially constant during preloading. In an example, after completing the preloading, the number of positive segments can be P and the number of negative segments can be N, and the ratio of positive segments to negative segments can be P/N. During an ongoing preloading, the number of positive segments that have been loaded can be p, and the number of negative segments that have been loaded can be n. During the preloading, a next segment can be selected based on whether p/(n+1) or (p+1)/n is closer to P/N (e.g., if p/(n+1) is closer to P/N than (p+1)/n, then the next segment can be a negative segment). In an example, the charge can be loaded incrementally based on the relationship between the charge corresponding to the first bit decision and the second bit decision (e.g., based on whether the first bit decision and the second bit decision are the same).

Figure 3B:
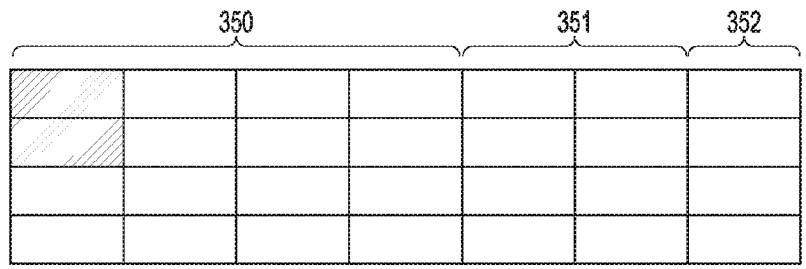
Figure 3C:
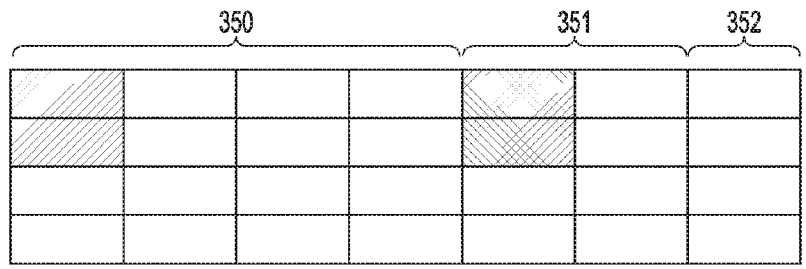
Figure 3D:
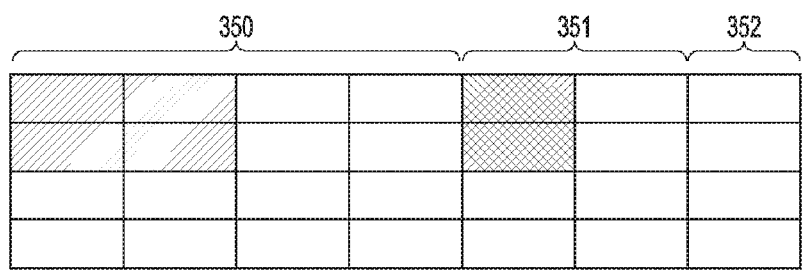
Figure 3E:
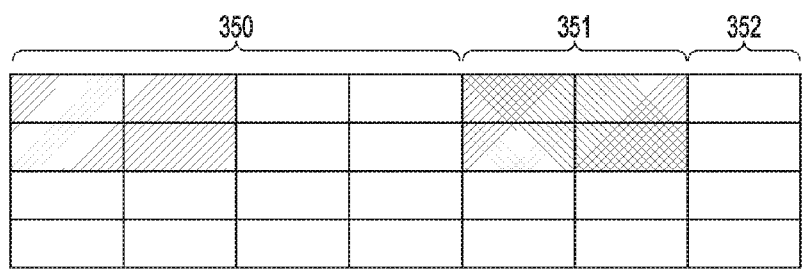
Figure 3F:
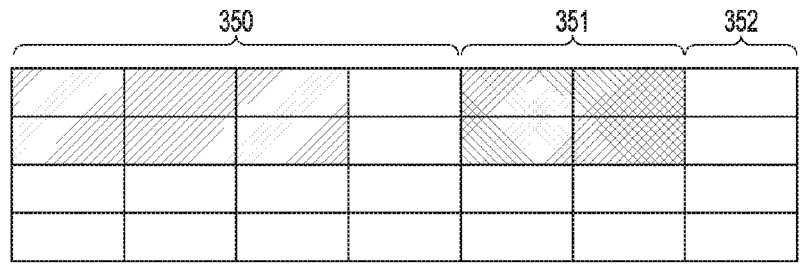
Figure 3G:
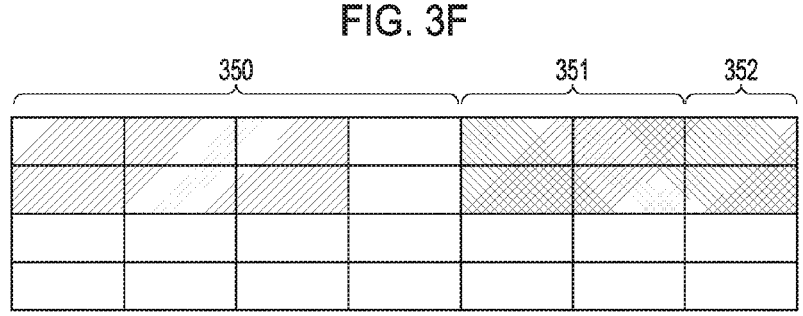
Figure 3H:
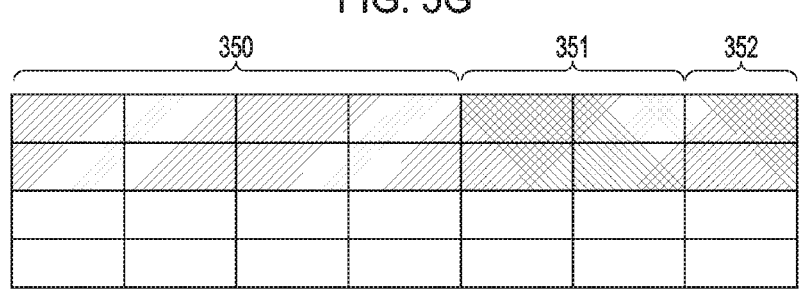

In accordance with the example described in FIG. 1C, a bit decision corresponding to a digital high can be incrementally loaded onto the capacitive elements 350 and 351, and a bit decision corresponding to a digital low can be incrementally loaded onto the capacitive element 352. During a first step as shown in FIG. 3B, charge corresponding to the predetermined bit decisions can be loaded onto segments corresponding to the first group. In a second step as shown in FIG. 3C, charge corresponding to the predetermined bit decisions can be loaded onto segments corresponding to the second group. In a third step as shown in FIG. 3D, charge corresponding to the predetermined bit decisions can be loaded onto segments corresponding to the third group. In a fourth step as shown in FIG. 3E, charge corresponding to the predetermined bit decisions can be loaded onto segments corresponding to the fourth group. In a fifth step as shown in FIG. 3F, charge corresponding to the predetermined bit decisions can be loaded onto segments corresponding to the fifth group. In a sixth step as shown in FIG. 3G, charge corresponding to the predetermined bit decisions can be loaded onto segments corresponding to the seventh group. In a seventh step as shown in FIG. 3H, charge corresponding to the predetermined bit decisions can be loaded onto segments corresponding to the sixth group.

Figure 3I:
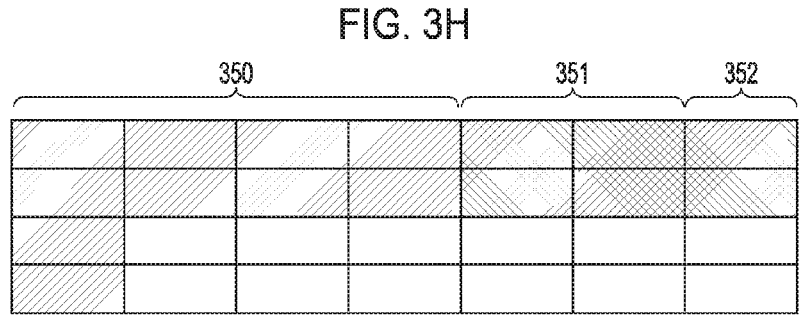
Figure 3J:
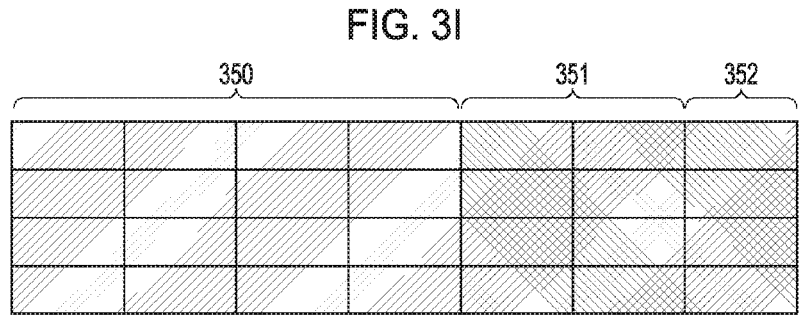

During the preloading process as shown in FIGS. 3B-3J, the voltages on the top plates can be determined according to the expression $$\Delta = \frac{C_x}{C_{total}} * (V_{refp} - V_{cm})$$

as discussed above in regard to FIG. 1C. In an example, during a sampling phase such as shown in FIG. 1A, a 3V signal can be applied to the bottom plates 115a of the first DAC 110a, a 2V signal can be applied to the bottom plates 115b of the second DAC 110b, a top plate common mode voltage of 0.9V can be applied to the top plates 120a of the first DAC 110a and the top plates 120b of the second DAC 110b, a capacitance of each of the segments can be 1 C and the top plate nodes, such as those connected to the top plates 120a and 120b can have a parasitic capacitance of 2 C, and when floating, each segment can have a capacitance of 0.1 C due to a parasitic capacitance. Prior to loading a charge onto the first group as shown in FIG. 3A, the voltage at the top plates 120*a* can be 0.9V and the voltage at the top plates 120*b* can be 0.9V. After loading the first group of charge as shown in FIG. 3B, the voltage at the top plates 120*a* can increase from 0.9V to 1.471V and the voltage at the top plates 120*b* can decrease from 0.9V to 0.329V. After loading the second group of charge as shown in FIG. 3C the voltage at the top plates 120*a* can decrease from 1.471V to 0.673V and the voltage at the top plates 120*b* can increase from 0.329V to 1.127V. After loading the third group of charge as shown in FIG. 3D, the voltage at the top plates 120*a* can increase from 0.673V to 1.089V and the voltage at the top plates 120*b* can decrease from 1.127V to 0.711V. After loading the fourth group of charge as shown in FIG. 3E the voltage at the top plates 120*a* can decrease from 1.089V to 0.577V and the voltage at the top plates 120*b* can increase from 0.711V to 1.222V. After loading the fifth group of charge as shown in FIG. 3F the voltage at the top plates 120*a* can increase to 0.9V and the voltage at the top plates 120*b* can decrease to 0.9V. After loading the sixth group of charge as shown in FIG. 3G, the voltage at the top plates 120*a* can decrease to 0.525V and the voltage at the top plates 120*b* can increase to 1.2755V. After loading the seventh group of charge as shown in FIG. 3H, the voltage at the top plates 120*a* can increase to 0.7876V and the voltage at the top plates 120*b* can decrease to 1.012V. After loading the remaining groups of charge as shown in FIGS. 3I and 3J, the voltage at the top plates 120*a* can be 0.768V and the voltage at the top plates 120*b* can be 1.031V.

In an example where there are seven groups and the seven groups are loaded with charge corresponding to a digital high, the seven groups can be loaded with charge in any order. In an example where there are seven groups and six of the groups are loaded with charge corresponding to a digital high, and one of the groups is loaded with a charge corresponding to a digital low, the seven groups can be loaded in any order, so long as the segments corresponding to the group loaded with a charge corresponding to a digital low is not loaded first. In an example where there are seven groups and five of the groups are loaded with charge corresponding to a digital high, and two of the groups are loaded with a charge corresponding to a digital low, the seven groups can be loaded in any order, so long as the segments corresponding to the two groups loaded with a charge corresponding to a digital low are not loaded first. In an example where there are seven groups and four of the groups are loaded with charge corresponding to a digital high, and three of the groups are loaded with a charge corresponding to a digital low, the seven groups can be loaded in any order, so long as the segments corresponding to the three groups loaded with a charge corresponding to a digital low are not loaded first. In an example where there are seven groups and four of the groups are loaded with charge corresponding to a digital low, and three of the groups are loaded with a charge corresponding to a digital high, the seven groups can be loaded in any order, so long as the segments corresponding to the three groups loaded with a charge corresponding to a digital high are not loaded first. In an example where there are seven groups and five of the groups are loaded with charge corresponding to a digital low, and two of the groups are loaded with a charge corresponding to a digital high, the seven groups can be loaded in any order, so long as the segments corresponding to the two groups loaded with a charge corresponding to a digital high are not loaded first. In an example where there are seven groups and six of the groups are loaded with charge corresponding to a digital low, and one of the groups is loaded with a charge corresponding to a digital high, the seven groups can be loaded in any order, so long as the segments corresponding to the group loaded with a charge corresponding to a digital high is not loaded first. In an example where there are seven groups and the seven groups are loaded with charge corresponding to a digital low, the seven groups can be loaded with charge in any order.

FIGS. 4A-4E show a method of sequentially preloading predetermined bit decisions, such as determined by an auxiliary ADC, into a thermometer coded DAC. A thermometer coding can be a unary coding, such as that shown in FIG. 5. The thermometer coded DAC, such as that shown in FIGS. 4A-4E, can include an array of logically adjacent capacitive cells, 411-417. In an example, logically adjacent capacitive cells can differ by one in bit position number (e.g., a capacitive cell corresponding to a most significant bit can be logically adjacent to a capacitive cell corresponding to a second most significant bit). The thermometer coded DAC can have a logical span equal to the number of logically adjacent capacitive cells (e.g., a thermometer coded DAC having seven logically adjacent cells can have a logical span of 7). A central position of the logically adjacent cells can be determined by dividing the logical span in half and rounding up. A portion of the capacitive cells can be loaded with a charge corresponding to a digital high, and a portion of the capacitive cells can be loaded with a charge corresponding to a digital low. In an example where more of the capacitive cells are loaded with a charge corresponding to a digital high than with a charge corresponding to a digital low, a majority charge can correspond to a digital high. In an example where more of the capacitive cells are loaded with a charge corresponding to a digital low than with a charge corresponding to a digital high, a majority charge can correspond to a digital low.

Figure 4A:
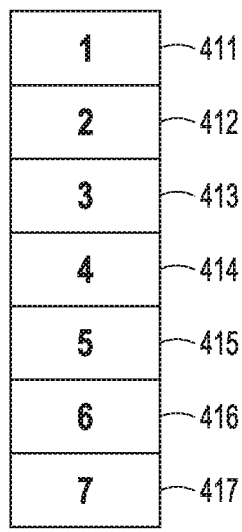
FIGS. 4A-4E illustrate a method for loading bit decisions into a thermometer encoded DAC.
Figure 4B:
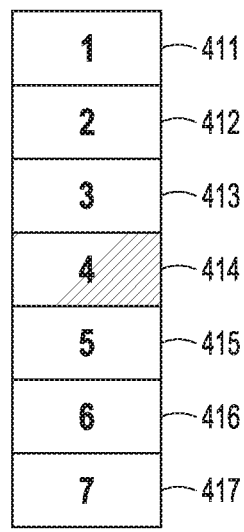
Figure 4C:
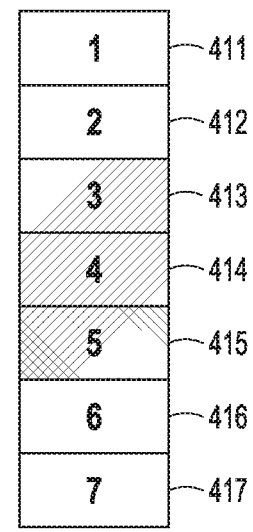
Figure 4D:
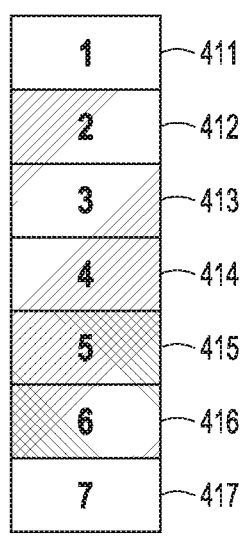
Figure 4E:
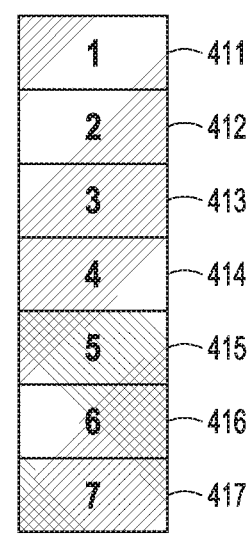

In a first step as shown in FIG. 4B, a majority charge corresponding to the predetermined most significant bit decision can be loaded onto the capacitive cell 414 having a central position in the array of logically adjacent capacitive cells. In a second step as shown in FIG. 4C, charge corresponding to the predetermined bit decisions can be loaded onto the capacitive cells 413 and 415 that are logically adjacent to the capacitive cell 414. A majority charge can be loaded onto the capacitive cell 413 and a majority or minority charge can be loaded onto the capacitive cell 415. In a third step as shown in FIG. 4D, charge corresponding to the predetermined bit decisions can be loaded onto the capacitive cells 412 and 416 that are logically adjacent to the capacitive cells 413 and 415. A majority charge can be loaded onto the capacitive cell 412 and a majority or minority charge can be loaded onto the capacitive cell 416. In a fourth step as shown in FIG. 4E, charge corresponding to the predetermined bit decisions can be loaded onto the capacitive cells 411 and 417 that are logically adjacent to the capacitive cells 412 and 416. A majority charge can be loaded onto the capacitive cell 411 and a majority or minority charge can be loaded onto the capacitive cell 417.

Figures 5, 6:
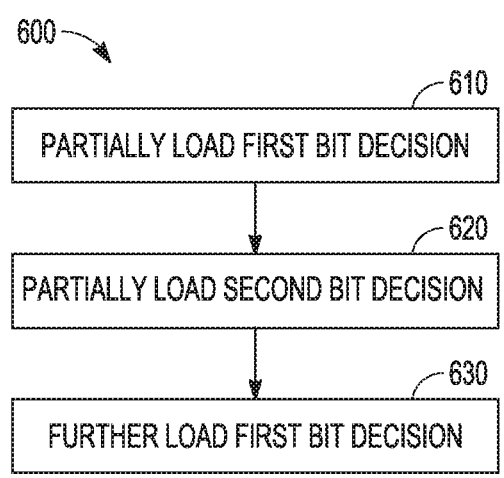
FIG. 5 illustrates a table showing a unary code.
FIG. 6 illustrates a method for incrementally loading predetermined bit decisions into a DAC.

FIG. 6 shows an example of a method of loading at least one predetermined bit decision onto a charge redistribution digital-to-analog converter, such as SAR ADC 100. An auxiliary ADC can determine at least one predetermined bit decision. Charge corresponding to a first predetermined bit decision can be partially loaded onto a first capacitive element (step 610). The first capacitive element can correspond to a most significant bit. Charge corresponding to a second predetermined bit decision can be partially loaded onto a second capacitive element (step 620). The second capacitive element can correspond to a second most significant bit or a third most significant bit. After partially loading charge corresponding to the first and second predetermined bit decisions, further charge corresponding to the first predetermined bit decision can be further partially loaded onto the first capacitive element (step 630). In an example, the first and second capacitive elements can be further loaded with further charge corresponding to the first and second predetermined bit decisions, respectively, until the first and second capacitive elements have been loaded with charge corresponding to first and second predetermined bit decisions.

The invention claimed is:

1. A method of loading at least one bit decision onto a charge redistribution digital-to-analog converter (DAC) including an array of capacitive elements corresponding to different bit positions, the method comprising:
   partially loading onto a first element having a first bit position, a charge associated with a first bit decision of the first element having the first bit position;
   at least partially loading onto a second element having a second bit position that is different from the first bit position, a charge associated with a second bit decision of the second element having the second bit position; and
   then further loading onto the first element having the first bit position, further charge associated with the first bit decision of the first element.

2. The method of claim 1, wherein:
   the partially loading onto the first element having the first bit position comprises, applying a voltage associated with the first bit decision of the first element having the first bit position onto a capacitor segment that is less than an entire aggregate capacitor associated with the first element having the first bit position.

3. The method of claim 2, comprising determining a relationship between charge associated with the first bit decision and charge associated with the second bit decision and based on the determined relationship, incrementally performing the loading of charge onto the first element and the second element.

4. The method of claim 2, comprising predetermining the first bit decision and the second bit decision using a separate auxiliary ADC.

5. The method of claim 2, wherein the first element and the second element respectively correspond to the most significant bit and the next most significant bit of the DAC.

6. The method of claim 2, wherein the partially loading onto the first element having a first bit position and the at least partially loading onto the second element having a second bit position are performed concurrently.

7. The method of claim 6, comprising then further loading onto the first element having the first bit position, further charge associated with the first bit decision of the first element and further loading onto the second element having the second bit position, further charge associated with the second bit decision of the second element, wherein the further loading onto the first element and the further loading onto the second element are performed concurrently.

8. The method of claim 2, wherein the partially loading onto the first element having a first bit position and the at least partially loading onto the second element having a second bit position are performed sequentially.

9. A system for loading at least one bit decision onto a charge redistribution digital-to-analog (DAC) converter having an array of capacitive elements, the system comprising:
   a first element having a first bit position;
   a second element having a second bit position that is different from the first bit position; and
   control circuitry configured to (i) partially load onto the first element having a first bit position, a charge associated with a first bit decision of the first element having the first bit position (ii) at least partially loading onto the second element having a second bit position, a charge associated with a second bit decision of the second element having the second bit position, and (iii) then further load onto the first element having the first bit position, further charge associated with the first bit decision of the first element.

10. The system of claim 9, wherein the first element having the first bit decision includes multiple capacitor segments and the control circuitry is further configured to apply a voltage associated with the first bit decision of the first element having the first bit position onto at least one capacitor segment, but not all of the multiple capacitor segments of the first element.

11. The system of claim 10, wherein the control circuitry is further configured to determine a relationship between charge associated with the first bit decision and charge associated with the second bit decision and based on the determined relationship, incrementally perform the loading of charge onto the first element and the second element.

12. The system of claim 10, comprising a separate auxiliary ADC configured to predetermine the first bit decision and the second bit decision.

13. The system of claim 10, wherein the first element and the second element respectively correspond to the most significant bit and the next most significant bit of the DAC.

14. The system of claim 10, wherein the controller is further configured to load charge onto the first element and the second element concurrently.

15. The system of claim 14, wherein the controller is further configured to then further load onto the first element having the first bit position, further charge associated with the first bit decision of the first element and simultaneously further load onto the second element having the second bit position, further charge associated with the second bit decision of the second element.

16. The system of claim 10, wherein the controller is further configured to load charge onto the first element and the second element sequentially.

17. A method of loading at least one bit decision onto a charge redistribution digital-to-analog converter (DAC) including a thermometer encoded array including a sequence of logically adjacent capacitive cells corresponding to different bit positions, the method comprising:
   loading onto a first cell having a position in the array of capacitive cells determined by a logical midpoint of the thermometer encoded array, a charge associated with a decoded most significant bit (MSB) decision; and
   then partially loading onto a second cell logically adjacent to the first cell, a charge associated with a decoded second bit decision, and partially loading onto a third element logically adjacent to the first cell, a charge associated with a decoded third bit decision and then further loading onto the second cell logically adjacent to the first cell, a charge associated with a decoded second bit decision.

18. The method of claim 17 wherein the decoded MSB decision is a majority bit decision included with a majority of the capacitive cells sharing a like charge in the sequence of logically adjacent capacitive cells.

19. The method of claim 18 wherein the second bit decision is a majority bit decision included with a majority of the capacitive cells sharing a like charge in the sequence of logically adjacent capacitive cells, and the third hit decision is a minority bit decision included with a minority of the capacitive cells sharing a like charge in the sequence of adjacent capacitive cells.

20. The method of claim 18 wherein the second bit decision is a majority bit decision included with a majority of the capacitive cells sharing a like charge in the sequence of logically adjacent capacitive cells, and the third bit decision is a majority bit decision included with a majority of the capacitive cells sharing a like charge in the sequence of adjacent capacitive cells.

\* \* \* \* \*